(12) United States Patent
Lee et al.

(10) Patent No.: US 9,564,298 B2
(45) Date of Patent: Feb. 7, 2017

(54) SEMICONDUCTOR MANUFACTURING APPARATUS AND SEMICONDUCTOR DEVICE MANUFACTURING METHOD USING THE SAME

(71) Applicant: Samsung Electronics Co., Ltd., Suwon-si (KR)

(72) Inventors: Ju-hee Lee, Hwaseong-si (KR); Su-ho Lee, Seongnam-si (KR); Won-hyuk Jang, Seoul (KR); Jae-beom Park, Suwon-si (KR); Ik-soo Kim, Yongin-si (KR); Myoung-woon Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 175 days.

(21) Appl. No.: 14/543,897

(22) Filed: Nov. 18, 2014

(65) Prior Publication Data

US 2015/0155140 A1 Jun. 4, 2015

(30) Foreign Application Priority Data

Dec. 4, 2013 (KR) ........................ 10-2013-0149997

(51) Int. Cl.
*H01J 37/32* (2006.01)

(52) U.S. Cl.
CPC ...... *H01J 37/3288* (2013.01); *H01J 37/32577* (2013.01); *H01J 37/32908* (2013.01)

(58) Field of Classification Search
CPC .............. H01J 37/3288; H01J 37/32908; H01J 37/32577
See application file for complete search history.

(56) References Cited

U.S. PATENT DOCUMENTS

| | | | |
|---|---|---|---|
| 5,968,379 A | 10/1999 | Zhao et al. | |
| 6,189,482 B1 | 2/2001 | Zhao et al. | |
| 6,666,928 B2 | 12/2003 | Worm | |
| 2006/0191879 A1* | 8/2006 | Tomita | H01J 37/32009 219/121.47 |
| 2013/0048222 A1 | 2/2013 | Tanaka et al. | |
| 2014/0251956 A1* | 9/2014 | Jeon | H01J 37/32568 216/71 |
| 2015/0136325 A1* | 5/2015 | Ye | H01J 37/32091 156/345.28 |

FOREIGN PATENT DOCUMENTS

| | | |
|---|---|---|
| JP | 11-354615 | 12/1999 |
| JP | 2001-274231 | 10/2001 |
| JP | 4563568 | 10/2010 |
| JP | 2012-084764 | 4/2012 |
| KR | 10-2003-0003547 | 1/2003 |
| KR | 10-2013-0059763 | 6/2013 |

* cited by examiner

*Primary Examiner* — Donald Raleigh
*Assistant Examiner* — Kevin Quarterman
(74) *Attorney, Agent, or Firm* — Muir Patent Law, PLLC

(57) ABSTRACT

A semiconductor manufacturing apparatus may include a chamber accommodating a substrate to be processed, a first electrode providing electric field in the chamber and a second electrode opposing to the first electrode, and a first power transmitting rod connected to one of the first electrode and the second electrode. A conductive stress attenuating unit may be formed in the first power transmitting rod. Methods of manufacturing semiconductor devices using the semiconductor manufacturing apparatus are also disclosed.

20 Claims, 9 Drawing Sheets

SEMICONDUCTOR MANUFACTURING APPARATUS AND SEMICONDUCTOR DEVICE MANUFACTURING METHOD USING THE SAME

CROSS-REFERENCE TO RELATED APPLICATIONS

This application claims the benefit of Korean Patent Application No. 10-2013-0149997, filed on Dec. 4, 2013, in the Korean Intellectual Property Office, the disclosure of which is incorporated herein in its entirety by reference.

BACKGROUND

The present disclosure relates to a semiconductor manufacturing apparatus and a method for manufacturing a semiconductor device using the apparatus. The semiconductor manufacturing apparatus may include rods.

Recently, in order to manufacture semiconductor devices, various kinds of semiconductor manufacturing apparatuses have been developed and used. Various kinds of processing environments including, for example, a vacuum, a high temperature, and plasma are required to manufacture a semiconductor device. Parts of a semiconductor manufacturing apparatus may deform in the processing environments, and time and cost may be required in maintaining and repairing the semiconductor manufacturing apparatus.

SUMMARY

The disclosure provides a semiconductor manufacturing apparatus capable of increasing an operating rate and reducing time and cost spent on maintaining and repairing the same. The disclosure also provides a method for manufacturing a semiconductor device using the semiconductor manufacturing apparatus.

According to an aspect of the inventive concept, there is provided a semiconductor manufacturing apparatus including a chamber, a first electrode formed in the chamber and a second electrode opposite the first electrode, and a first power transmitting rod connected to one of the first electrode and the second electrode. The first power transmitting rod has one end portion and another end portion. A first conductive stress attenuating unit is formed between the one end portion and the other end portion of the first power transmitting rod.

The semiconductor manufacturing apparatus may further include a substrate support mounted in the chamber and a processing head opposite the substrate support. The first power transmitting rod may be inserted into the substrate support.

The first electrode may include a ground electrode plate arranged in the substrate support, and the second electrode may include a radio frequency (RF) power electrode plate arranged in the processing head.

The semiconductor manufacturing apparatus may further include a heat generator arranged in the substrate support and a second power transmitting rod electrically connected to the heat generator. The second power transmitting rod may have one end portion and another end portion.

A second conductive stress attenuating unit may be formed between the one end portion and the other end portion of the second power transmitting rod.

The first conductive stress attenuating unit may be a coil spring or a plate spring.

The first conductive stress attenuating unit and the two end portions of the first power transmitting rod may be integrated with each other.

The first conductive stress attenuating unit and the two end portions of the first power transmitting rod may be entirely linear.

The first power transmitting rod may comprise a plurality of conductive stress attenuating units.

The first power transmitting rod may include at least one bent portion between the one end portion and the other end portion and the first conductive stress attenuating unit may be formed between the one end portion and the bent portion of the first power transmitting rod.

The chamber may include a chemical vapor deposition (CVD) chamber, a sputtering chamber, or a dry etching chamber.

The chamber may be provided with vacuum, plasma, or a high temperature.

According to another aspect of the inventive concept, there is provided a semiconductor manufacturing apparatus including a chamber, a substrate support formed in the chamber, a shower head opposite the substrate support, an RF power electrode plate formed in the shower head, a ground electrode plate formed in the substrate support, and an integrated RF rod connected to the RF power electrode plate or the ground electrode plate. A conductive stress attenuating unit is formed in the integrated RF rod.

The semiconductor manufacturing apparatus may further include a heat generator formed in the substrate support and electrically insulated from the ground electrode plate.

The RF rod may be electrically connected to the ground electrode plate. The conductive stress attenuating unit and both ends of the RF rod may be entirely linear. The area of a cross-section of the RF rod may be about 12 square millimeters or more.

The present disclosure also provide a method for manufacturing a semiconductor device comprising a step of accommodating a substrate on a substrate support in a manufacturing apparatus, a step of processing the substrate in a manufacturing environment, and a step of removing the substrate from the substrate support, wherein the manufacturing apparatus comprises a chamber including the substrate support, a first electrode providing electric field in the chamber, a second electrode opposite the first electrode, a first power transmitting rod electrically connected to one of the first electrode and the second electrode, and a first conductive stress attenuating unit, wherein the first conductive stress attenuating unit is formed in the first power transmitting rod.

The manufacturing environment may be plasma, high temperature or vacuum. The manufacturing apparatus may further comprise a second power transmitting rod electrically connected to the other of the first electrode and the second electrode. The manufacturing apparatus may further comprise a second conductive stress attenuating unit formed in the second power transmitting rod. The first conductive stress attenuating unit may be a coil spring or a plate spring. The area of a cross-section of the first power transmitting rod may be about 12 square millimeters or more.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
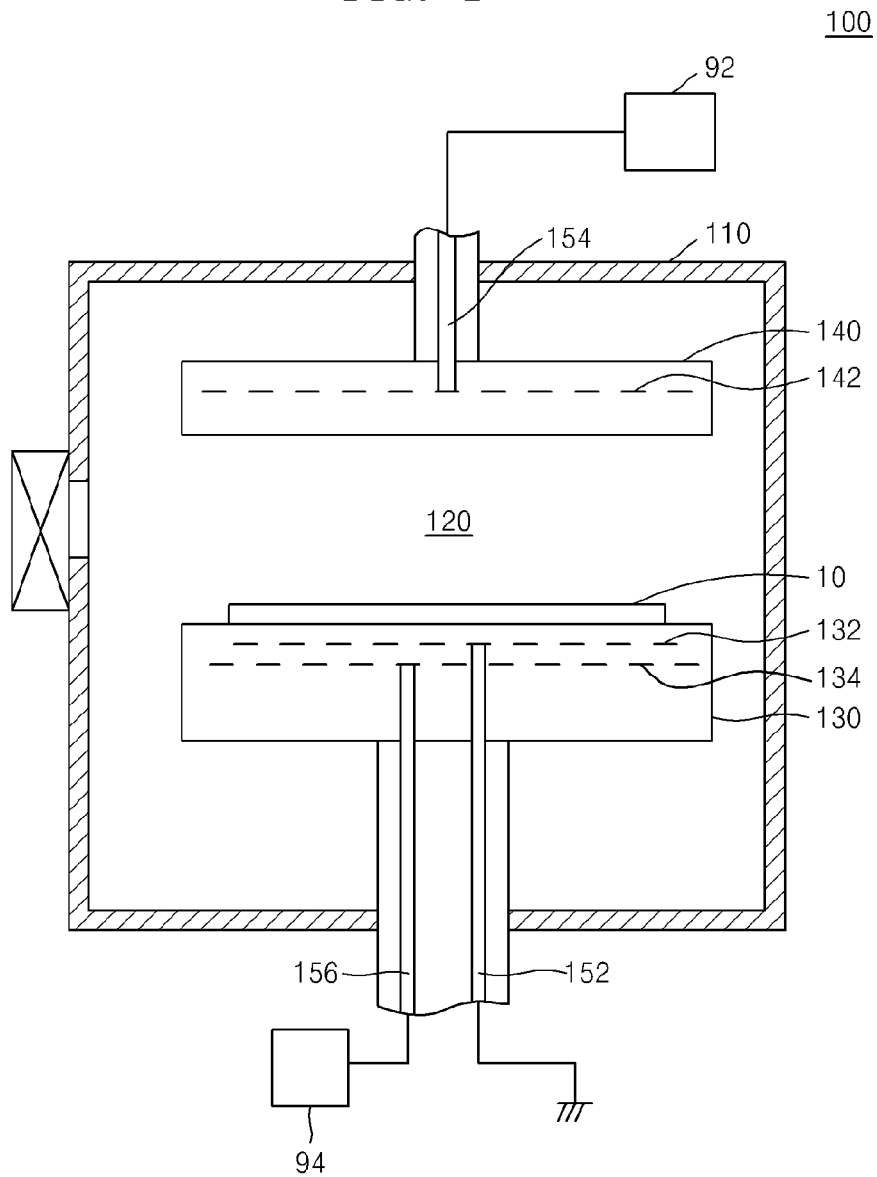
FIG. 1 is a schematic diagram illustrating a semiconductor manufacturing apparatus, according to an embodiment of the inventive concept.

The disclosure will now be described more fully with reference to the accompanying drawings, in which exemplary embodiments of the inventive concept are shown. The same elements in the drawings are denoted by the same reference numerals and a repeated explanation thereof may not be given. The inventive concept may, however, be embodied in many different forms and should not be construed as limited to the exemplary embodiments set forth herein. In the drawings, the thickness of layers and regions may be exaggerated for clarity.

It will also be understood that when an element is referred to as being "on" another element, it can be directly on the other element, or intervening elements may also be present. On the other hand, when an element is referred to as contacting, or being "immediately on" another element, it can be understood that intervening elements do not exist. Other expressions describing a relationship between elements, for example, "between" and "directly between", or "adjacent" and "directly adjacent" may be interpreted as described above.

It will be understood that, although the terms first and second, etc., may be used herein to describe various elements, these elements should not be limited by these terms. Unless the context indicates otherwise, these terms are only used to distinguish one element from another element, i.e., as a naming convention. For example, a first element may be named a second element and similarly a second element may be named a first element without departing from the scope of the inventive concept.

Unless otherwise defined, terms such as "comprise," "include," and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The terms "substantially," or "about" may be used herein to reflect this meaning.

Unless otherwise defined, all terms (including technical and scientific terms) used herein have the same meaning as commonly understood by one of ordinary skill in the art to which this technology belongs.

Hereinafter, exemplary embodiments of the inventive concept will be described in detail with reference to the accompanying drawings.

FIG. 1 is a schematic diagram illustrating a semiconductor manufacturing apparatus, according to an embodiment of the inventive concept.

Referring to FIG. 1, a semiconductor manufacturing apparatus 100 may include a chamber 110, a substrate support 130 and a processing head 140. The substrate support 130 and the processing head 140 may be arranged in the chamber 110. A processing space 120 may be formed between the substrate support 130 and the processing head 140. A substrate 10 may be accommodated on the substrate support 130 and processed in the processing space 120. Processing environments may be formed in the processing space 120 to process the substrate 10.

The chamber 110 may have a structure that implements a vacuum state, which may seal the chamber 110 from outside. The chamber 110 may include some other elements for processing the substrate 10. In addition, although not specifically shown in FIG. 1, the semiconductor manufacturing apparatus 100 may further include an element for transferring the substrate 10 from the outside of the chamber 110 to the substrate support 130 or from the substrate support 130 to the outside of the chamber 110. The semiconductor manufacturing apparatus 100 may include an element for forming the atmosphere in the chamber 110. The semiconductor manufacturing apparatus 100 may include an element supplying raw material gas, reaction gas, and purge gas to the inside of the chamber 110. The semiconductor manufacturing apparatus 100 may include an element for removing or exhausting gases used for processing the substrate 10 and by-products formed during the processing of the substrate 10. The semiconductor manufacturing apparatus 100 may also include an element for vacuumizing the inside of the chamber 110.

The chamber 110 may be formed of a conductive material such as aluminium, stainless steel, metal, or metal alloy, for example. An internal surface of the chamber 110 may be coated with a resistant material in order to reduce chemical erosion or may be formed of a removable liner. The coated resistant material or the liner may be a, for example, ceramic material or a resistant metal such as metal oxide, alumina, yttria, titanium or a combination of some of these. The chamber 110 may include an insulating member or a shielding for protecting elements that form the chamber 110. The insulating member or the shielding may be an insulating material including, for example, ceramic, glass, quartz, plastic, mixtures thereof, compounds thereof and combinations thereof.

The substrate 10 may be arranged or disposed on the substrate support 130 to be exposed to the processing space 120 between the substrate support 130 and the processing head 140. The semiconductor manufacturing apparatus 100 may process different types of substrates. The substrate 10 may be, for example, a semiconductor substrate such as a silicon wafer, a silicon carbide substrate. In certain embodiments, the substrate 10 may be a gallium nitride substrate or a sapphire substrate. The size of the substrate 10 may be, in certain embodiments, 200 mm, 300 mm, or 450 mm in diameter. The substrate 10 may be, for example, a glass substrate or a plastic substrate for manufacturing a flat panel display or a flexible display. It is illustrated that one substrate 10 is arranged on the substrate support 130 as shown in FIG. 1. However, the inventive concept is not limited thereto. A plurality of substrates 10 may also be arranged together on the substrate support 130.

Various conditions may be provided to the processing space 120 before, during and after the processing of the substrate 10. The processing space 120 may be vacuumized. The processing space 120 may be provided with gas, liquid and/or solid sources. The processing space 120 may be maintained with plasma, high temperature and/or low pressure including vacuum state.

A first electrode 132 and a second electrode 142 corresponding to each other may be installed in the substrate support 130 and the processing head 140 respectively. The first electrode 132 and/or the second electrode 142 may be, for example, grid-shaped. The first electrode 132 and the second electrode 142, in one embodiment, may provide direct current (DC) bias in the processing space 120. In certain embodiments, the first electrode 132 and the second electrode 142 may form a plasma environment in the processing space 120.

A ground and a first power source 92 may be connected to the first electrode 132 and the second electrode 142, respectively. The first electrode 132 and the second electrode 142 may be connected to the ground and the first power source 92 by a ground rod 152 and a power rod 154, respectively. The first electrode 132 and the ground rod 152 may be connected by, for example, welding or clamping. The second electrode 142 and the power rod 154 may be connected by, for example, welding or clamping. Since the first electrode 132 is formed in the substrate support 130, the ground rod 152 may be inserted into the substrate support 130 to be connected to the first electrode 132. Since the second electrode 142 is formed in the processing head 140, the power rod 154 may be inserted into the processing head 140 to be connected to the second electrode 142. In certain embodiments, the first power source 92 may provide a single frequency radio frequency (RF) signal or a mixed frequency RF signal. The single frequency RF signal may have an electric power between about 1 W and about 3,000 W for example. The single frequency RF signal may have a frequency between about 300 kHz and about 60 MHz, for example.

When the substrate support 130 and/or the processing head 140 are formed of conductors, the ground rod 152 and/or the power rod 154 may be surrounded by a shield member (not shown). The shield member may insulate the ground rod 152 and/or the power rod 154 from their surroundings or may block electromagnetic waves generated by the ground rod 152 and/or the power rod 154.

When the substrate support 130 and/or the processing head 140 are formed of insulators, the ground rod 152 and/or the power rod 154 may be formed to be inserted into rod inserting holes (not shown) formed in the substrate support 130 and/or the processing head 140.

The substrate support 130 and/or the processing head 140 may be formed of, for example, insulating material such as ceramic, graphite or other materials durable against chemical and/or mechanical processes. A graphite substrate support 130 or a graphite processing head 140 may be coated with silicon or silicon carbide. The substrate support 130 and/or the processing head 140 may be formed of metal such as aluminium, stainless steel, and nickel, or metal alloys. The substrate support 130 may be referred to as a pedestal or a susceptor. The substrate support 130 may function as a heater for heating the substrate 10 or as a chuck for fixing the substrate 10. The processing head 140 may include the second electrode 142 corresponding to the first electrode 132 formed in the substrate support 130. The processing head 140 may be, for example, a shower head or a sputtering target fixing head.

When the plasma environment is formed in the processing space 120, the first power source 92, the first electrode 132, the second electrode 142, the ground rod 152, and the power rod 154 may be respectively referred to as an RF power source 92, a ground electrode plate 132, an RF power electrode plate 142, a ground rod 152, and an RF power rod 154. Thus, when the plasma environment is formed in the processing space 120, the first power source 92 may be the RF power source 92, to which RF power is applied. In addition, although not shown, the semiconductor manufacturing apparatus 100 may further include an element for an RF matching network for the RF power. In certain embodiments, plasma may be provided at a power level from about 10 W to about 3,000 W at a frequency of 13.56 MHz.

A heat generating member 134 for heating the substrate 10 may be formed in the substrate support 130. The heat generating member 134 may be electrically insulated from the first electrode 132, that is, the ground electrode plate 132 in the substrate support 130.

Electric power may be transmitted from a second power source 94 to the heat generating member 134 through a second power transmitting rod 156. The electric power may be the source of heat generated in the heat generating member 134. The heat generating member 134 and the second power transmitting rod 156 may be connected by, for example, welding or clamping. Therefore, the heat generating member 134 may be electrically connected to the second power transmitting rod 156. Since the heat generating member 134 is formed in the substrate support 130, the second power transmitting rod 156 may be inserted into the substrate support 130 to be connected to the heat generating member 134. The heat generating member 134 may be, for example, an electric resistance hot wire or an electric resistance heating wire. The heat generating member 134 may be formed of, for example, molybdenum, tungsten, alumina ($Al_2O_3$), or aluminium nitride (AlN). The first power source 92 and the second power source 94 may be referred to as an RF power source 92 and a heater power source 94, respectively. The first power source 92 and the second power source 94 are illustrated as separate elements but may be combined to one power supplying apparatus. The second power transmitting rod 156 may be referred to as a heater rod 156. The heater rod 156 may be, for example, a thermocouple.

First power transmitting rods 152 and 154 including the ground rod 152 and the power rod 154 and the second power transmitting rod 156 may be referred to as rods 152, 154, and 156 for the sake of convenience. Therefore, the first power transmitting rods 152 and 154 may be inserted into the substrate support 130. The rods 152, 154, and 156 may be formed of, for example, nickel. The rods 152, 154, and 156 may be formed of stress attenuating units having at least some parts which may absorb stress caused by expansion and contraction. The at least some parts of the rods 152, 154, and 156 may be, for example, springs. However, the inventive concept is not limited thereto and any members that provide resilience when they are transformed may be used as the at least some parts of the rods 152, 154, and 156. Specific shapes of the rods 152, 154, and 156 will be described later.

In FIG. 1, it is illustrated that the rods 152, 154, and 156 are extended from the inside of the chamber 110 to the outside of the chamber 110. However, the inventive concept is not limited thereto and the rods 152, 154, and 156 may be arranged to be positioned only in the chamber 110.

The chamber 110 may be a chemical vapour deposition (CVD) chamber, a sputtering chamber, or a dry etching chamber. That is, the semiconductor manufacturing apparatus 100 may be a CVD apparatus, a sputtering apparatus, or a dry etching apparatus. However, the inventive concept is not limited thereto. The semiconductor manufacturing apparatus 100 may be any semiconductor manufacturing apparatus which uses the rods 152, 154, and 156 for transmitting power, and processing the substrate 10 in the chamber 110.

Figure 2:
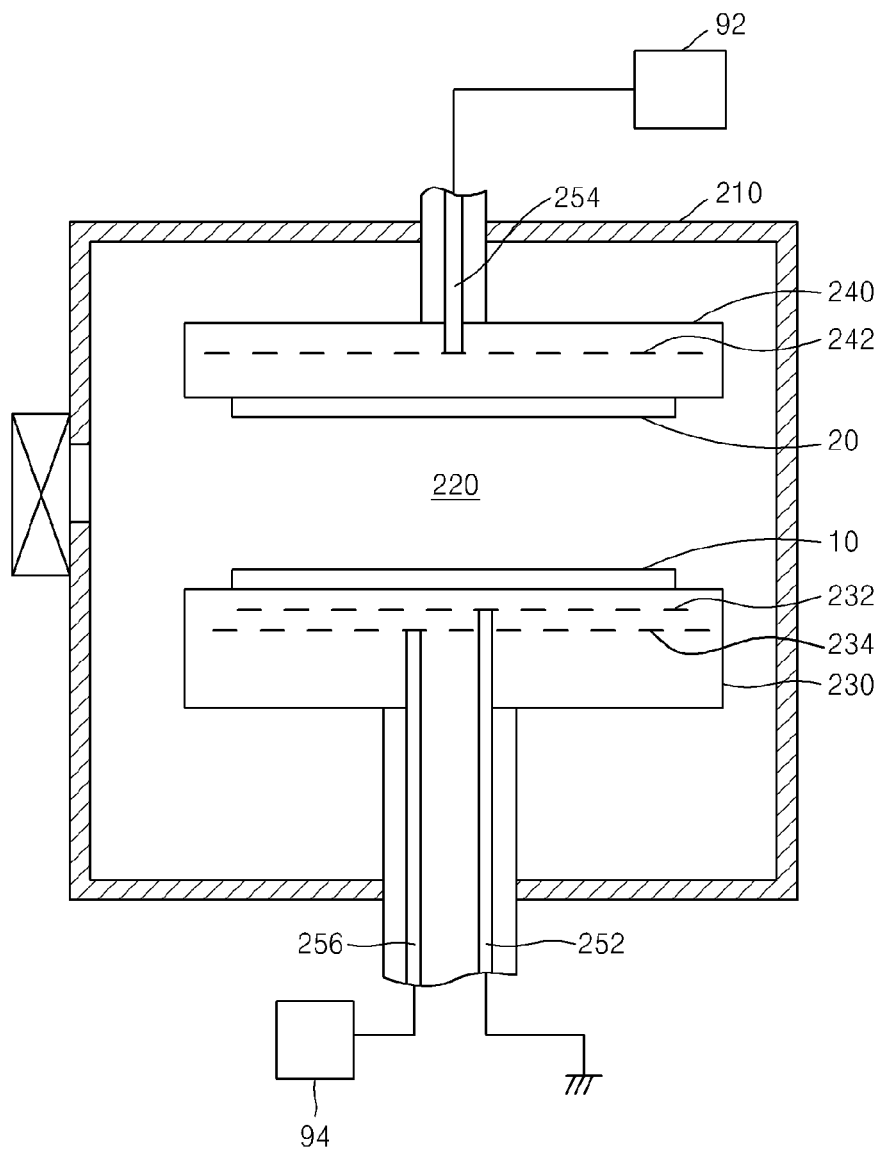
FIG. 2 is a schematic diagram illustrating a semiconductor manufacturing apparatus, according to another embodiment of the inventive concept.

FIG. 2 is a schematic diagram illustrating a semiconductor manufacturing apparatus, according to another embodiment of the inventive concept. Certain elements already described in relation to FIG. 1 will not be repeatedly described here in relation to FIG. 2.

Referring to FIG. 2, a semiconductor manufacturing apparatus 200 includes a chamber 210, a substrate support 230 and a processing head 240. The substrate support 230 and the processing head 240 may be arranged in the chamber 210. A processing space 220 may be formed between the substrate support 230 and the processing head 240. A substrate 10 may be accommodated on the substrate support 230 and processed in the processing space 220. Processing environments may be formed in the processing space 220 to process the substrate 10.

The substrate 10 may be arranged on the substrate support 230 to be exposed to the processing space 220. In addition, a second substrate 20 may be arranged on the processing head 240.

A first electrode 232 and a second electrode 242 corresponding to each other may be respectively arranged in the substrate support 230 and the processing head 240. The first electrode 232 and the second electrode 242 may form a direct current (DC) bias in the processing space 220. The first electrode 232 and the second electrode 242 may also form a plasma environment in the processing space 220.

A ground and a first power source 92 may be connected to the first electrode 232 and the second electrode 242, respectively. The first electrode 232 and the second electrode 242 may be connected to the ground and the first power source 92 by a ground rod 252 and a power rod 254, respectively.

The processing head 240 may include the second electrode 242 corresponding to the first electrode 232 formed in the substrate support 230. The processing head 240 may be a sputtering target fixing head.

A heat generating member 234 for heating the substrate 10 may be formed in the substrate support 230.

Electric power may be transmitted from the second power source 94 to the heat generating member 234 through a second power transmitting rod 256. The electric power may be the source of heat generated in the heat generating member 234.

The chamber 210 may be a sputtering chamber. That is, the semiconductor manufacturing apparatus 200 may be a sputtering apparatus or a dry etching apparatus. However, the inventive concept is not limited thereto. The semiconductor manufacturing apparatus 200 may be any semiconductor manufacturing apparatus in which the substrate 10 is processed by using the chamber 210 and the rods 252, 254, and 256 for transmitting power.

Figure 3:
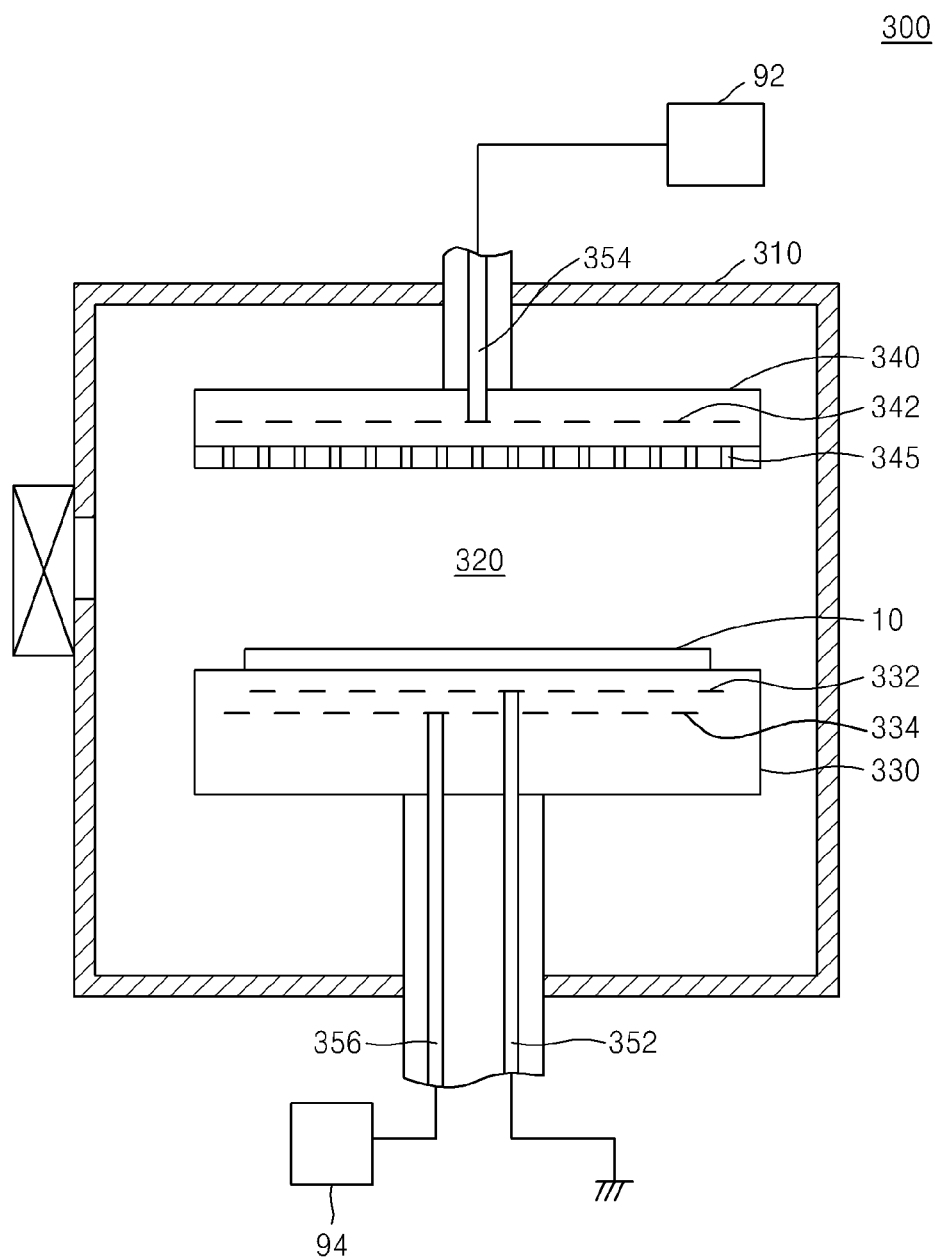
FIG. 3 is a schematic diagram illustrating a semiconductor manufacturing apparatus, according to another embodiment of the inventive concept.

FIG. 3 is a schematic diagram illustrating a semiconductor manufacturing apparatus, according to another embodiment of the inventive concept. Certain elements already described in relation to FIG. 1 or 2 will not be repeatedly described here in relation to FIG. 3.

Referring to FIG. 3, a semiconductor manufacturing apparatus 300 includes a chamber 310, a substrate support 330 and a processing head 340. The substrate support 330 and the processing head 340 is arranged in the chamber 310. A processing space 320 may be formed between the substrate support 330 and the processing head 340. A substrate 10 is accommodated in the chamber 310 and may be processed in the processing space 320. Processing environments may be formed in the processing space 320 to process the substrate 10.

The substrate 10 may be arranged on the substrate support 330 to be exposed to the processing space 320.

A first electrode 332 and a second electrode 342 corresponding to each other may be respectively arranged in the substrate support 330 and the processing head 340. A direct current (DC) bias may be formed in the processing space 320. At the same time or alternatively, a plasma environment may be formed in the processing space 320 by an electric field between the first electrode 332 and the second electrode 342.

A ground and a first power source 92 may be connected to the first electrode 332 and the second electrode 342, respectively. The first electrode 332 may be connected to the ground by a ground rod 352. The second electrode 342 may be connected to the first power source 92 by a power rod 354.

Shower head spray holes 345 may be formed in the processing head 340. Therefore, the processing head 340 may be referred to as a shower head 340. The shower head spray holes 345 may be connected to an element for supplying a raw material gas, a reaction gas, and/or a purge gas to the inside of the chamber 310. The raw material gas, the reaction gas, and the purge gas may be supplied to the processing space 320 through the shower head spray holes 345 of the shower head 340.

A heat generating member 334 for heating the substrate 10 may be formed in the substrate support 330.

Electric power may be transmitted from a second power source 94 to the heat generating member 334 through a second power transmitting rod 356. The electric power may be the source of heat generated by the heat generating member 334.

The chamber 310 may be a CVD chamber. The chamber 310 may be, for example, a plasma enhanced chemical vapour deposition (PECVD) chamber. That is, the semiconductor manufacturing apparatus 300 may be a CVD apparatus, for example, a PECVD apparatus. However, the inventive concept is not limited thereto. The semiconductor manufacturing apparatus 300 may be any semiconductor manufacturing apparatus which uses the rods 352, 354, and 356 for transmitting power, and processing the substrate 10 in the chamber 310.

Referring to FIGS. 1 to 3, the ground rods 152, 252, and 352, the power rods 154, 254, and 354, or the heater rods 156, 256, and 356 may be tubes or solid rods.

The ground rods 152, 252, and 352, the power rods 154, 254, and 354, or the heater rods 156, 256, and 356 may be entirely linear. However, the inventive concept is not limited thereto and examples of other shapes of the ground rods, the power rods, and the heater rods will be described with reference to FIGS. 4 to 6.

Figure 4:
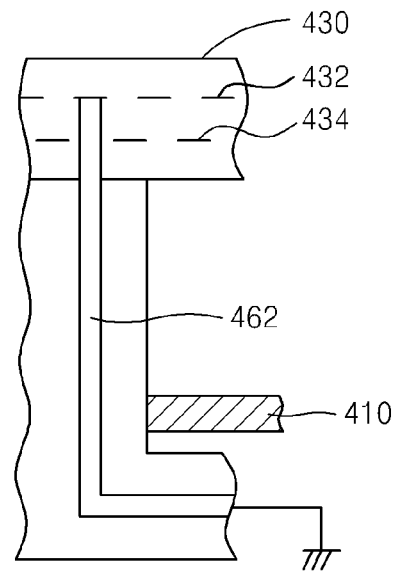
FIG. 4 is a schematic diagram illustrating a ground rod included in a semiconductor manufacturing apparatus, according to an embodiment of the inventive concept.

FIG. 4 is a schematic diagram illustrating a ground rod included in a semiconductor manufacturing apparatus according to an embodiment of the inventive concept. Certain elements already described in relation to FIGS. 1 to 3 will not be repeatedly described here in relation to FIG. 4.

Referring to FIG. 4, a ground rod 462 may be bent. The ground rod 462 may be extended straight or linearly from one end, and then it may be bent at an angle. The angle may be 90 degrees, or may be other angles. Next, it may be extended straight or linearly to the other end. In FIG. 4, the ground rod 462 is illustrated as being bent outside a chamber 410. However, the ground rod 462 may be bent in the chamber 410. In addition, the ground rod 462 is illustrated as being bent once. However, the ground rod 462 may be bent two or more times.

The ground rod 462 illustrated in FIG. 4 may be used for the semiconductor manufacturing apparatuses 100, 200, and 300 instead of the ground rods 152, 252, and 352 illustrated in FIGS. 1 to 3.

Figure 5:
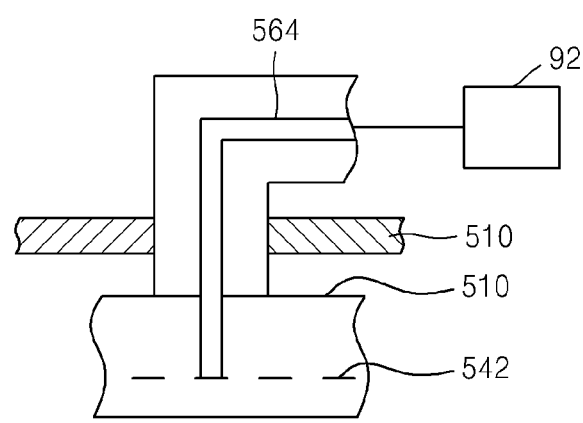
FIG. 5 is a schematic diagram illustrating a power rod included in a semiconductor manufacturing apparatus, according to an embodiment of the inventive concept.

FIG. 5 is a schematic diagram illustrating a power rod included in a semiconductor manufacturing apparatus according to an embodiment of the inventive concept. Certain elements already described in relation to FIGS. 1 to 4 will not be repeatedly described here in relation to FIG. 5.

Referring to FIG. 5, a power rod 564 may be bent. The power rod 564 may be extended straight or linearly from one end, and then it may be bent at an angle. The angle may be 90 degrees, or may be other angles. Next, it may be extended straight or linearly to the other end. In FIG. 5, the power rod 564 is illustrated as being bent outside a chamber 510. However, the power rod 564 may be bent in the chamber 510. In addition, the power rod 564 is illustrated as being bent once. However, the power rod 564 may be bent two or more times.

The power rod 564 illustrated in FIG. 5 may be used for the semiconductor manufacturing apparatuses 100, 200, and 300 instead of the power rods 154, 254, and 354 illustrated in FIGS. 1 to 3.

Figure 6:
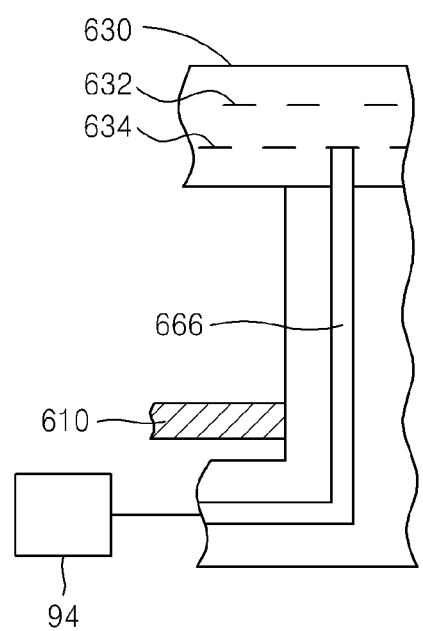
FIG. 6 is a schematic diagram illustrating a heater rod included in a semiconductor manufacturing apparatus, according to an embodiment of the inventive concept.

FIG. 6 is a schematic diagram illustrating a heater rod included in a semiconductor manufacturing apparatus according to an embodiment of the inventive concept. Certain elements already described in relation to FIGS. 1 to 5 will not be repeatedly described here in relation to FIG. 6.

Referring to FIG. 6, a heater rod 666 may be bent. The heater rod 666 may be extended straight or linearly from one end, and then it may be bent at an angle. The angle may be 90 degrees, or may be other angles. Next, it may be extended straight or linearly to the other end. In FIG. 6, the heater rod 666 is illustrated as being bent outside a chamber 610. However, the heater rod 666 may be bent in the chamber 610. In addition, the heater rod 666 is illustrated as being bent once. However, the heater rod 666 may be bent two or more times.

The heater rod 666 illustrated in FIG. 6 may be used for the semiconductor manufacturing apparatuses 100, 200, and 300 instead of the heater rods 156, 256, and 356 illustrated in FIGS. 1 to 3.

The ground rod 462, the power rod 564, and the heater rod 666 illustrated in FIGS. 4 to 6 may be used for the semiconductor manufacturing apparatuses 100, 200, and 300 illustrated in FIGS. 1 to 3 instead of the ground rods 152, 252, and 352, the power rods 154, 254, and 354, and the heater rods 156, 256, and 356. However, the ground rod 462, the power rod 564, and the heater rod 666 may be used instead of one or two rods among the ground rods 152, 252, and 352, the power rods 154, 254, and 354, and the heater rods 156, 256, and 356.

Figure 7A:
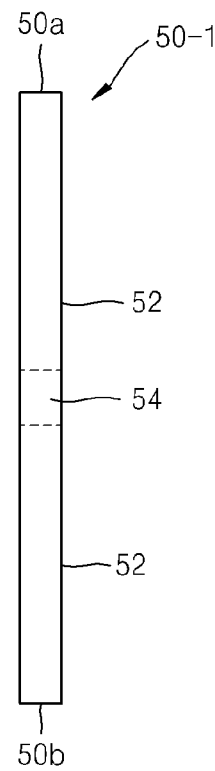
FIGS. 7A and 7B are schematic diagrams illustrating some rods including one or more conductive stress attenuating units, according to some embodiments of the inventive concept.
Figure 7B:
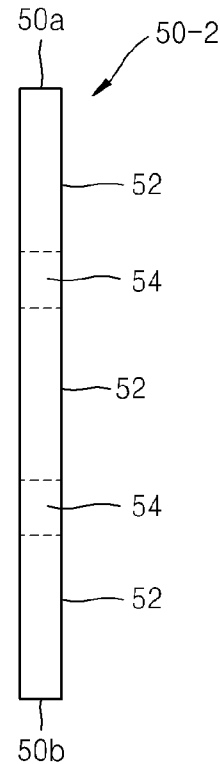

FIGS. 7A and 7B are schematic diagrams illustrating a rod including a conductive stress attenuating unit according to an embodiment of the inventive concept.

Referring to FIG. 7A, a rod 50-1 includes one end portion 50a and another end portion 50b that are opposite to each other. A conductive stress attenuating unit 54 is formed between the one end portion 50a and the other end portion 50b. Specifically, one rod body portion 52 extends from one end of the rod 50-1 to the other end of the rod 50-1. Another rod body portion 52 extends from the other end of the rod 50-1 to the one end of the rod 50-1. The conductive stress attenuating unit 54 is formed between the rod body portions 52. The one end portion 50a and the other end portion 50b are parts of the rod body portions 52 adjacent to respective ends of the rod 50-1.

The rod body portions 52 may be, for example, tubes or solid rods. The conductive stress attenuating unit 54 may be, for example, a coil spring or a plate spring. The conductive stress attenuating unit 54 may also be referred to herein as a flexible rod portion.

The one end portion 50a, the other end portion 50b, and the conductive stress attenuating unit 54 may be integrated with each other. For example, in the rod 50-1, the rod body portions 52 and the conductive stress attenuating unit 54 between the one end and the other end may be integrated with each other.

The one end portion 50a, the other end portion 50b, and the conductive stress attenuating unit 54 may be entirely linear or straight. For example, in the rod 50-1, the rod body portions 52 and the conductive stress attenuating unit 54 all of which are disposed between the one end and the other end may be entirely linear. Here, that the rod 50-1 is entirely linear means that the rod body portions 52 and the conductive stress attenuating unit 54 are arranged along a straight line extended from the one end to the other end of the rod 50-1. Therefore, in one embodiment, the conductive stress attenuating unit 54 does not deviate from the straight line extending from the one end to the other end of the rod 50-1. However, a part of the rod body portions 52 or a part of the conductive stress attenuating unit 54 may deviate from the straight line. Cross-sectional areas of the rod body portions 52 or the conductive stress attenuating unit 54 may also change or vary depending on their position.

The conductive stress attenuating unit 54 is illustrated to be formed in an intermediate part between the one end portion 50a and the other end portion 50b of the rod 50-1. Specifically, the conductive stress attenuating unit 54 is illustrated to be positioned at the centre of the rod 50-1. However it is not limited thereto, for example, the conductive stress attenuating unit 54 may be formed to be closer to one end portion of the rod 50-1. As another example, the conductive stress attenuating unit 54 may be formed at one of the end portions 50a and 50b.

The rod 50-1 may be a whole or a part of the rods 152, 154, and 156 illustrated in FIG. 1, a whole or a part of the rods 252, 254, and 256 illustrated in FIG. 2, and a whole or a part of the rods 352, 354, and 356 illustrated in FIG. 3.

When the rod 50-1 is one of the first power transmitting rods 152/154, 252/254, and 352/354 illustrated in FIGS. 1 to 3, the one end portion 50a, the other end portion 50b, and the conductive stress attenuating unit 54 may be respectively referred to as a first one end portion 50a, a first other end portion 50b, and a first conductive stress attenuating unit 54. When the rod 50-1 is one of the second power transmitting rods 156, 256, and 356 illustrated in FIGS. 1 to 3, the one end portion 50a, the other end portion 50b, and the conductive stress attenuating unit 54 may be respectively referred to as a second one end portion 50a, a second other end portion 50b, and a second conductive stress attenuating unit 54.

Referring to FIG. 7B, a rod 50-2 includes one end portion 50a and another end portion 50b that are opposite to each other. A plurality of conductive stress attenuating units 54 are formed between the one end portion 50a and the other end portion 50b. Specifically, one rod body portion 52 extends from one end of the rod 50-2 to the other end of the rod 50-2. Another rod body portion 52 extends from the other end of the rod 50-2 to the one end of the rod 50-2. Two or more separate conductive stress attenuating units 54 may be formed between the rod body portions 52. There may be one or more other rod body portions 52 between the separate conductive stress attenuating units 54. One or more conductive stress attenuating units 54 may be positioned at the end portions 50a and/or 50b.

The one end portion 50a, the other end portion 50b, and the plurality of conductive stress attenuating units 54 may be integrated with each other. For example, in one embodiment, the rod 50-2 is an integrated rod in which the rod body portions 52, the plurality of conductive stress attenuating units 54 the one end portion 50a and the other end portion 50b may be integrated with each other.

The one end portion 50a, the other end portion 50b, and the plurality of conductive stress attenuating units 54 may be entirely linear or straight. For example, in the rod 50-2, the rod body portions 52, and the plurality of conductive stress attenuating units 54 may be entirely linear between the one end portion 50a and the other end portion 50b, or may be on the straight line connecting the one end portion 50a and the other end portion 50b.

FIG. 7B shows an example of rod 50-2 comprising two conductive stress attenuating units 54. However, the inventive concept is not limited thereto. The rod 50-2 may include three or more separate conductive stress attenuating units 54.

The rod 50-2 may be the whole or a part of one of the rods 152, 154, and 156 illustrated in FIG. 1, the whole or a part of one of the rods 252, 254, and 256 illustrated in FIG. 2, and/or the whole or a part of one of the rods 352, 354, and 356 illustrated in FIG. 3.

Figure 8A:
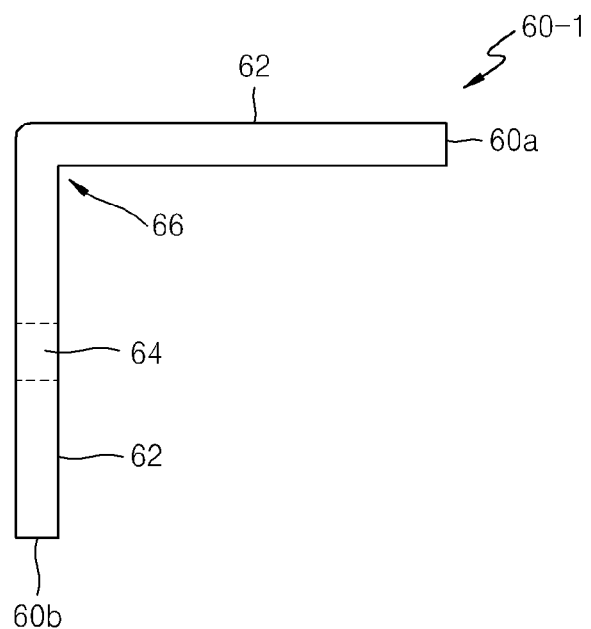
FIGS. 8A and 8B are schematic diagrams illustrating some rods including one or more conductive stress attenuating units, according to some other embodiments of the inventive concept.
Figure 8B:
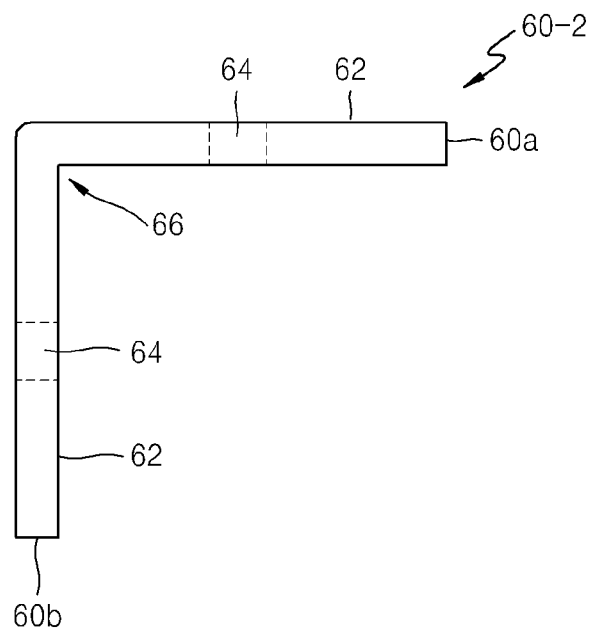

FIGS. 8A and 8B are schematic diagrams illustrating a rod including a conductive stress attenuating unit, according to another embodiment of the inventive concept. Certain elements described in relation to FIGS. 7A and 7B will not be repeatedly described here in relation to FIGS. 8A and 8B.

Referring to FIG. 8A, a rod 60-1 includes one end portion 60a and another end portion 60b that are opposite to each other and at least one bent portion 66 is formed between the one end portion 60a and the other end portion 60b. A conductive stress attenuating unit 64 is formed between the other end portion 60b and the bent portion 66 of the rod 60-1. Specifically, a rod body portion 62 extends from the other end portion 60b to the bent portion 66. Another rod body portion 62 extends from the bent portion 66 to the other end portion 60b of the rod 60-1. A conductive stress attenuating unit 64 is formed between the rod body portions 62. In FIG. 8A, the conductive stress attenuating unit 64 is illustrated to be formed between the other end portion 60b and the bent portion 66. However, the conductive stress attenuating unit 64 may be formed between the one end portion 60a and the bent portion 66.

The one end portion 60a, the other end portion 60b, the bent portion 66, and the conductive stress attenuating unit 64 may be integrated with each other. For example, the rod 60-1 may be an integrated rod, in which the rod body portions 62, the conductive stress attenuating unit 64, and the end portions 60a, 60b may be integrated with each other.

The rod 60-1 may be entirely linear from the one end portion 60a to the bent portion 66. The rod 60-1 may be entirely linear from the other end portion 60b to the bent portion 66. When the conductive stress attenuating unit 64 is formed between the one end portion 60a and the bent portion 66, the rod 60-1 may be entirely linear from the one end portion 60a to the bent portion 66 through the conductive stress attenuating unit 64. When the conductive stress attenuating unit 64 is formed between the other end portion 60b and the bent portion 66, the rod 60-1 may be entirely linear from the other end portion 60b to the bent portion 66 through the conductive stress attenuating unit 64.

The rod 60-1 may be the whole or a part of one of the ground rod 462, the power rod 564, and the heater rod 666 illustrated in FIGS. 4 to 6.

FIG. 8A shows an embodiment where one conductive stress attenuating unit 64 is formed between the other end portion 60b and the bent portion 66. However, two or more separate conductive stress attenuating units 64 may be formed between the other end portion 60b and the bent portion 66 of the rod 60-1 or between the one end portion 60a and the bent portion 66 of the rod 60-1. A stress attenuating unit 64 may be formed in the bent portion 66 instead of, or in addition to, the attenuating unit 64 of FIG. 8A. In this case, the stress attenuating unit 64 may be a connector between the two straight portions of the rod 60-1.

Referring to FIG. 8B, a rod 60-2 includes one end portion 60a and another end portion 60b that are opposite to each other and one conductive stress attenuating unit 64 is formed between the one end portion 60a and a bent portion 66. Another conductive stress attenuating unit 64 is formed between the other end portion 60b and the bent portion 66.

The rod 60-2 may be the whole or a part of one of the ground rod 462, the power rod 564, and the heater rod 666 illustrated in FIGS. 4 to 6.

In FIG. 8B, one conductive stress attenuating unit 64 is formed between the one end portion 60a and the bent portion 66, and another conductive stress attenuating unit 64 is formed between the other end portion 60b and the bent portion 66. However, two or more separate conductive stress attenuating units 64 may be formed between the one end portion 60a and the bent portion 66 of the rod 60-2. Similarly, two or more separate conductive stress attenuating units 64 may be formed between the other end portion 60b and the bent portion 66 of the rod 60-2. A stress attenuating unit 64 may be formed in the bent portion 66. In this case, the stress attenuating unit 64 may be a connector between the two straight portions of the rod 60-2.

Figure 9A:
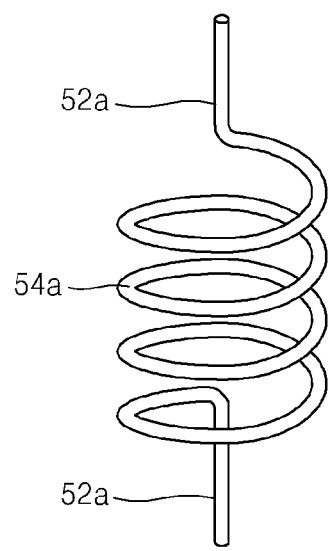
FIGS. 9A to 9C are schematic diagrams illustrating some conductive stress attenuating units, according to some embodiments of the inventive concept.
Figure 9B:
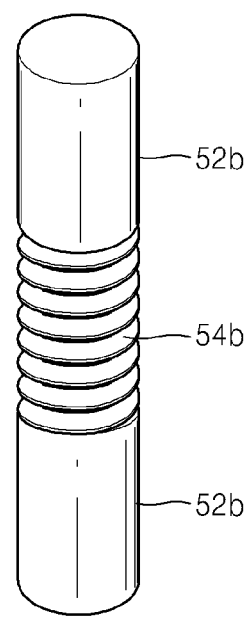
Figure 9C:
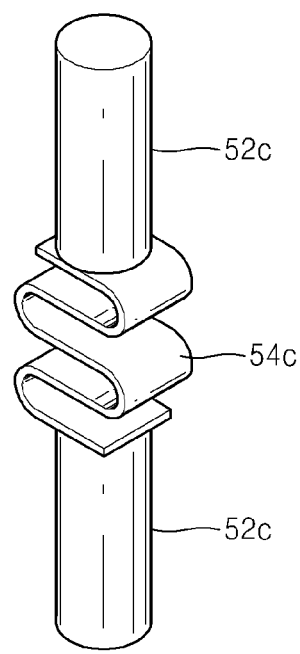

FIGS. 9A to 9C are schematic diagrams illustrating a conductive stress attenuating unit, according to certain exemplary embodiments of the inventive concept. The elements already described in relation to FIGS. 7A to 8B will not be repeatedly described here in discussing FIGS. 9A to 9C.

Referring to FIG. 9A, a conductive stress attenuating unit 54*a* may be a coil spring. The conductive stress attenuating unit 54*a* may be, for example, a spiral spring whose cross-section is circular. The conductive stress attenuating unit 54*a* may be integrated with rod body portions 52*a*. For example, both the conductive stress attenuating unit 54*a* and rod body portions 52*a* may be formed of a same continuous material. Cross-sections of the rod body portions 52*a* and the conductive stress attenuating unit 54*a* may have the same or similar circular shapes. The conductive stress attenuating unit 54*a* may be formed by transforming a part of a rod having a circular cross-section. The spiral conductive stress attenuating unit 54*a* may extend in one direction. The part that is not transformed to be spiral and that is extending in one direction may be one of the rod body portions 52*a*.

The rod body portions 52*a* and the conductive stress attenuating unit 54*a* may correspond to the rod body portions 52 and the conductive stress attenuating unit 54 of FIGS. 7A and 7B or the rod body portions 62 and the conductive stress attenuating unit 64 of FIGS. 8A and 8B.

Referring to FIG. 9B, a conductive stress attenuating unit 54*b* may be a plate spring. The conductive stress attenuating unit 54*b* may be, for example, a spiral plate spring having a thin square cross-section. The conductive stress attenuating unit 54*b* may be integrated with rod body portions 52*b*. The virtual shape connecting the outermost lines and points of the conductive stress attenuating unit 54*b* may be a cylinder or a similar shape to a cylinder. Cross-sections of the virtual shape may be the same as cross-sections of the rod body portions 52*b*, or similar to cross-sections of the rod body portions 52*b*. For example, the conductive stress attenuating unit 54*b* may be arranged in a space of an extension of the rod body portions 52*b* that contact one side or both sides of the conductive stress attenuating unit 54*b*. The conductive stress attenuating unit 54*b* may be formed by forming a groove in a part of a rod having a circular cross-section and extended in one direction. Therefore, the rod may transform to a spiral plate spring. The parts that are not transformed to be spiral and that are extended in one direction may form the rod body portions 52*b*.

The rod body portions 52*b* and the conductive stress attenuating unit 54*b* may respectively correspond to the rod body portions 52 and the conductive stress attenuating unit 54 of FIGS. 7A and 7B. The rod body portions 52*b* and the conductive stress attenuating unit 54*b* may respectively correspond to the rod body portions 62 and the conductive stress attenuating units 64 of FIGS. 8A and 8B.

Referring to FIG. 9C, a conductive stress attenuating unit 54*c* may be a plate spring. The conductive stress attenuating unit 54*c* may be, for example, a zigzag plate spring having a square cross-section. At least one bend may be formed in the conductive stress attenuating unit 54*c*. The conductive stress attenuating unit 54*c* may be separately formed from rod body portions 52*c* and then, may be adhered to the rod body portions 52*c*.

The rod body portions 52*c* and the conductive stress attenuating unit 54*c* may respectively correspond to the rod body portions 52 and the conductive stress attenuating units 54 of FIGS. 7A and 7B. The rod body portions 52*c* and the conductive stress attenuating unit 54*c* may respectively correspond to the rod body portions 62 and the conductive stress attenuating units 64 of FIGS. 8A and 8B.

The conductive stress attenuating units 54*a*, 54*b*, and 54*c* illustrated in FIGS. 9A to 9C may be formed in a part of at least one of the rods 152, 154, and 156 illustrated in FIG. 1, the rods 252, 254, and 256 illustrated in FIG. 2, the rods 352, 354, and 356 illustrated in FIG. 3, and the rods 462, 564, and 666 illustrated in FIGS. 4 to 6. The rods 152, 154, 156, 252, 254, 256, 352, 354, 356, 462, 564, and 666 may be under stress when they are contracted or expanded by the processing environments in the semiconductor manufacturing apparatuses 100, 200, and 300. The conductive stress attenuating units 54*a*, 54*b*, and 54*c* may attenuate the stress of contraction or expansion of the rods.

When the conductive stress attenuating units 54*a*, 54*b*, and 54*c* are not formed in the rods 152, 154, 156, 252, 254, 256, 352, 354, 356, 452, 554, and 666, the contacts between the rods and the electrodes 132, 232, 332, 142, 242, and 342 or the heat generating members 134, 234, and 334 may deteriorate. However, when the conductive stress attenuating units 54*a*, 54*b*, and 54*c* attenuate the stress, the contacts may remain in good condition for a long time. Therefore, operating rate of the semiconductor manufacturing apparatuses 100, 200, and 300 may increase, and maintenance expense of the apparatuses 100, 200 and 300 may decrease.

A semiconductor device manufacturing method will be described with reference to FIGS. 1 through 9C according to an embodiment of the present disclosure. The method may use a semiconductor manufacturing apparatus 100, 200 or 300 described above. Therefore, duplicate descriptions may be avoided here. A substrate 10 may be accommodated on a substrate support 130, 230 or 330. The substrate 10 may be, for example, a silicon wafer, a silicon carbide substrate, a gallium nitride substrate or a sapphire substrate. The substrate 10 may be processed in an environment of plasma, high temperature or vacuum in a chamber 110, 210 or 310. The substrate 10 is then removed from the substrate support 130, 230, or 330. In one embodiment, the substrate may then be formed into a device. For example, the substrate may be a semiconductor substrate, which may be formed into a semiconductor chip, and packaged into a semiconductor package that includes a package substrate, the semiconductor chip, and an encapsulant.

A cross-section of the rods described in the above embodiments may be circle, oval, square, another polygon or similar. The area of the cross-section may be about 12 square millimeters or more. When the cross-section is circle or similar, the diameter may be about 4 millimeters or more.

While the disclosure shows and describes a limited number of exemplary embodiments, it will be understood that various changes may be made therein without departing from the spirit and scope of the disclosure. Therefore, the scope of the disclosure should be interpreted by the claims of this application.

What is claimed is:

1. A semiconductor manufacturing apparatus comprising:
   a chamber;
   a first electrode formed in the chamber;
   a second electrode opposite the first electrode; and
   a first power transmitting rod connected to one of the first electrode and the second electrode, the first power transmitting rod having one end portion and another end portion,
   wherein, a first conductive stress attenuating unit is formed between the one end portion and the other end portion of the first power transmitting rod.

2. The semiconductor manufacturing apparatus of claim 1, further comprising a substrate support mounted in the chamber and a processing head opposite the substrate support,
   wherein the first power transmitting rod is inserted into the substrate support.

3. The semiconductor manufacturing apparatus of claim 2, wherein the first electrode comprises a ground electrode plate arranged in the substrate support, and
wherein the second electrode comprises a radio frequency (RF) power electrode plate arranged in the processing head.

4. The semiconductor manufacturing apparatus of claim 2, further comprising:
a heat generator arranged in the substrate support; and
a second power transmitting rod electrically connected to the heat generator, the second power transmitting rod having one end portion and another end portion.

5. The semiconductor manufacturing apparatus of claim 4, wherein a second conductive stress attenuating unit is formed between the one end portion and the other end portion of the second power transmitting rod.

6. The semiconductor manufacturing apparatus of claim 1, wherein the first conductive stress attenuating unit is a coil spring or a plate spring.

7. The semiconductor manufacturing apparatus of claim 1, wherein the first conductive stress attenuating unit and the two end portions of the first power transmitting rod are integrated with each other.

8. The semiconductor manufacturing apparatus of claim 1, wherein the first conductive stress attenuating unit and the two end portions of the first power transmitting rod are entirely linear.

9. The semiconductor manufacturing apparatus of claim 1, wherein the first power transmitting rod comprises a plurality of conductive stress attenuating units.

10. The semiconductor manufacturing apparatus of claim 1,
wherein the first power transmitting rod comprises at least one bent portion, and
wherein the first conductive stress attenuating unit is formed between one end portion and the bent portion of the first power transmitting rod.

11. The semiconductor manufacturing apparatus of claim 1, wherein the chamber comprises a chemical vapor deposition (CVD) chamber, a sputtering chamber, or a dry etching chamber.

12. The semiconductor manufacturing apparatus of claim 1, wherein the chamber is provided with vacuum, plasma, or a high temperature.

13. A semiconductor manufacturing apparatus comprising:
a chamber;
a substrate support formed in the chamber;
a shower head opposite the substrate support;
an RF power electrode plate formed in the shower head;
a ground electrode plate formed in the substrate support; and
an integrated RF rod connected to at least one of the RF power electrode plate and the ground electrode plate,
wherein a conductive stress attenuating unit is formed in the integrated RF rod.

14. The semiconductor manufacturing apparatus of claim 13, further comprising a heat generator formed in the substrate support and electrically insulated from the ground electrode plate.

15. The semiconductor manufacturing apparatus of claim 13,
wherein the RF rod is electrically connected to the ground electrode plate, and
wherein the conductive stress attenuating unit and both ends of the RF rod are entirely linear.

16. The semiconductor manufacturing apparatus of claim 13, wherein the area of a cross-section of the RF rod is about 12 square millimeters or more.

17. A method for manufacturing a semiconductor device, comprising steps of:
accommodating a substrate on a substrate support in a manufacturing apparatus;
processing the substrate in a manufacturing environment; and
removing the substrate from the substrate support,
wherein the manufacturing apparatus comprises,
a chamber including the substrate support,
a first electrode providing electric field in the chamber,
a second electrode opposite the first electrode,
a first power transmitting rod electrically connected to one of the first electrode and the second electrode, and
a first conductive stress attenuating unit formed in the first power transmitting rod.

18. The method of claim 17, wherein the manufacturing environment is plasma, high temperature or vacuum.

19. The method of claim 18, wherein the manufacturing apparatus further comprises:
a second power transmitting rod electrically connected to the other of the first electrode and the second electrode; and
a second conductive stress attenuating unit formed in the second power transmitting rod.

20. The method of claim 16, wherein the first conductive stress attenuating unit is a coil spring or a plate spring, and the area of a cross-section of the first power transmitting rod is about 12 square millimeters or more.

* * * * *